United States Patent
Tu et al.

(10) Patent No.: US 8,232,596 B2
(45) Date of Patent: Jul. 31, 2012

(54) SEMICONDUCTOR STRUCTURE AND FABRICATION METHOD THEREOF

(75) Inventors: Shang-Hui Tu, Tainan (TW); Hung-Shern Tsai, Tainan County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 524 days.

(21) Appl. No.: 12/426,144

(22) Filed: Apr. 17, 2009

(65) Prior Publication Data

US 2010/0163989 A1 Jul. 1, 2010

(30) Foreign Application Priority Data

Dec. 30, 2008 (TW) .............................. 97151390 A

(51) Int. Cl.
 *H01L 29/66* (2006.01)
(52) U.S. Cl. ................. 257/343; 257/E29.261
(58) Field of Classification Search .................. 257/333, 257/343, 342, 341, 33, 336, 408, 328, E21.427, 257/E21.417, E21.418, E27.148, E29.265, 257/E29.314, E29.027, E29.256, E29.261
See application file for complete search history.

(56) References Cited

U.S. PATENT DOCUMENTS

| | | | | |
|---|---|---|---|---|
| 5,055,896 A * | 10/1991 | Williams et al. | ............ | 257/409 |
| 5,132,753 A * | 7/1992 | Chang et al. | ............ | 257/655 |
| 5,406,110 A * | 4/1995 | Kwon et al. | ............ | 257/493 |
| 6,110,803 A * | 8/2000 | Tung | ............ | 438/442 |
| 6,117,738 A * | 9/2000 | Tung | ............ | 438/286 |
| 6,211,552 B1 * | 4/2001 | Efland et al. | ............ | 257/343 |
| 6,979,875 B2 * | 12/2005 | Kwon et al. | ............ | 257/492 |
| 7,202,529 B2 * | 4/2007 | Krumbein et al. | ............ | 257/343 |
| 7,655,978 B2 * | 2/2010 | Liu | ............ | 257/335 |
| 7,960,786 B2 * | 6/2011 | Huang et al. | ............ | 257/341 |
| 8,058,703 B2 * | 11/2011 | Lee | ............ | 257/592 |
| 2003/0193067 A1 * | 10/2003 | Kim et al. | ............ | 257/343 |
| 2005/0179108 A1 * | 8/2005 | Hossain et al. | ............ | 257/492 |
| 2006/0001122 A1 * | 1/2006 | Ichijo et al. | ............ | 257/491 |
| 2006/0175658 A1 * | 8/2006 | Lee | ............ | 257/341 |
| 2007/0296046 A1 * | 12/2007 | Ohdaira et al. | ............ | 257/401 |
| 2010/0025726 A1 * | 2/2010 | Paul et al. | ............ | 257/141 |
| 2010/0102386 A1 * | 4/2010 | You | ............ | 257/336 |
| 2010/0207207 A1 * | 8/2010 | Tsai | ............ | 257/343 |

\* cited by examiner

*Primary Examiner* — Matthew Landau
*Assistant Examiner* — Latanya N Crawford

(57) ABSTRACT

A method for fabrication of a semiconductor device is provided. A first type doped body region is formed in a first type substrate. A first type heavily-doped region is formed in the first type doped body region. A second type well region and second type bar regions are formed in the first type substrate with the second type bar regions between the second type well region and the first type doped body region. The first type doped body region, the second type well region, and each of the second type bar regions are separated from each other by the first type substrate. The second type bar regions are inter-diffused to form a second type continuous region adjoining the second type well region. A second type heavily-doped region is formed in the second type well region.

7 Claims, 5 Drawing Sheets

SEMICONDUCTOR STRUCTURE AND FABRICATION METHOD THEREOF

CROSS REFERENCE TO RELATED APPLICATIONS

This Application claims priority of Taiwan Patent Application No. 97151390, filed on Dec. 30, 2008, the entirety of which is incorporated by reference herein.

BACKGROUND OF THE INVENTION

1. Field of the Invention

The present invention relates to a semiconductor structure and fabrication method thereof.

2. Description of the Related Art

For current integrated circuit development, controllers, memories, low-voltage (LV) circuits and high-voltage (HV) power devices are being integrated into a single chip, referred to as a single-chip system. For example, to handle high voltage and current, double-diffused metal oxide semiconductor (DMOS) transistors, frequently used as conventional power devices, operate with low on-resistance while sustaining high voltage. Thus, lateral double-diffused metal oxide semiconductor (LDMOS) transistors in particular, with a simple structure, are being incorporated into VLSI logic circuits.

However, the surface field of LDMOS transistors limits the voltage tolerance therein. Moreover, when operating an LDMOS device of an interdigitated structure, a high electric field occurring adjacent to the tip of a finger-shaped source results in decreased breakdown voltage of the device. Particularly, a high electric field, caused from scaling-down of related devices, decreasing device size as well as width of the source or curvature radius of the finger end, results in a very serious decrease of breakdown voltage. However, if the width of the finger shaped source is widened to enlarge the curvature radius of the finger end in order to increase the breakdown voltage and eliminate the problem mentioned above, layout flexibility of the device is sacrificed, thus hindering development for further scaling-down of related devices.

An improved semiconductor device ameliorating the disadvantages of the conventional technology is desirable.

BRIEF SUMMARY OF INVENTION

A detailed description is given in the following embodiments with reference to the accompanying drawings.

The invention provides a semiconductor structure and method for fabricating the same. In an embodiment of the method for fabricating the semiconductor structure, a first type doped body region is formed in a first type substrate. A first type heavily-doped region is formed in the first type doped body region. A second type well region and second type bar regions are formed in the first type substrate with the second type bar regions between the second type well region and the first type doped body region. The first type doped body region, the second type well region, and each of the second type bar regions are separated from each other by the first type substrate. The second type bar regions are inter-diffused to form a second type continuous region adjoining the second type well region. A second type heavily-doped region is formed in the second type well region.

In an embodiment of the semiconductor structure of the present invention, a first type body doped region is disposed on the first type substrate. A first type heavily-doped region is disposed on the first type body doped region. A second type well region is disposed on the first type substrate. A plurality of second type bar regions is disposed between the second type well region and the first type body doped region. The first type body doped region, the second type well region, and each of the second type bar regions are separated to one another by the first type substrate. A second type heavily-doped region is disposed on the second type well region. An isolation structure is disposed on the first type substrate between the first type heavily-doped region and second type heavily-doped region. A gate structure is disposed on the first type substrate between the first type heavily-doped region and isolation structure.

In another embodiment of the semiconductor structure, a first type body doped region is disposed on a first type substrate. A first type heavily-doped region is disposed on the first type body doped region. A second type well region is disposed on the first type substrate. A diffused second type well region is disposed between the second type well region and first type body doped region and adjoined to the second type well region. A second type impurity concentration of the diffused second type well region is lower than a second type impurity concentration of the second type well region. A second type heavily-doped region is disposed on the second type well region. An isolation structure is disposed on the diffused second type well region. A gate structure on the first type substrate is disposed between the first type heavily-doped region and isolation structure.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
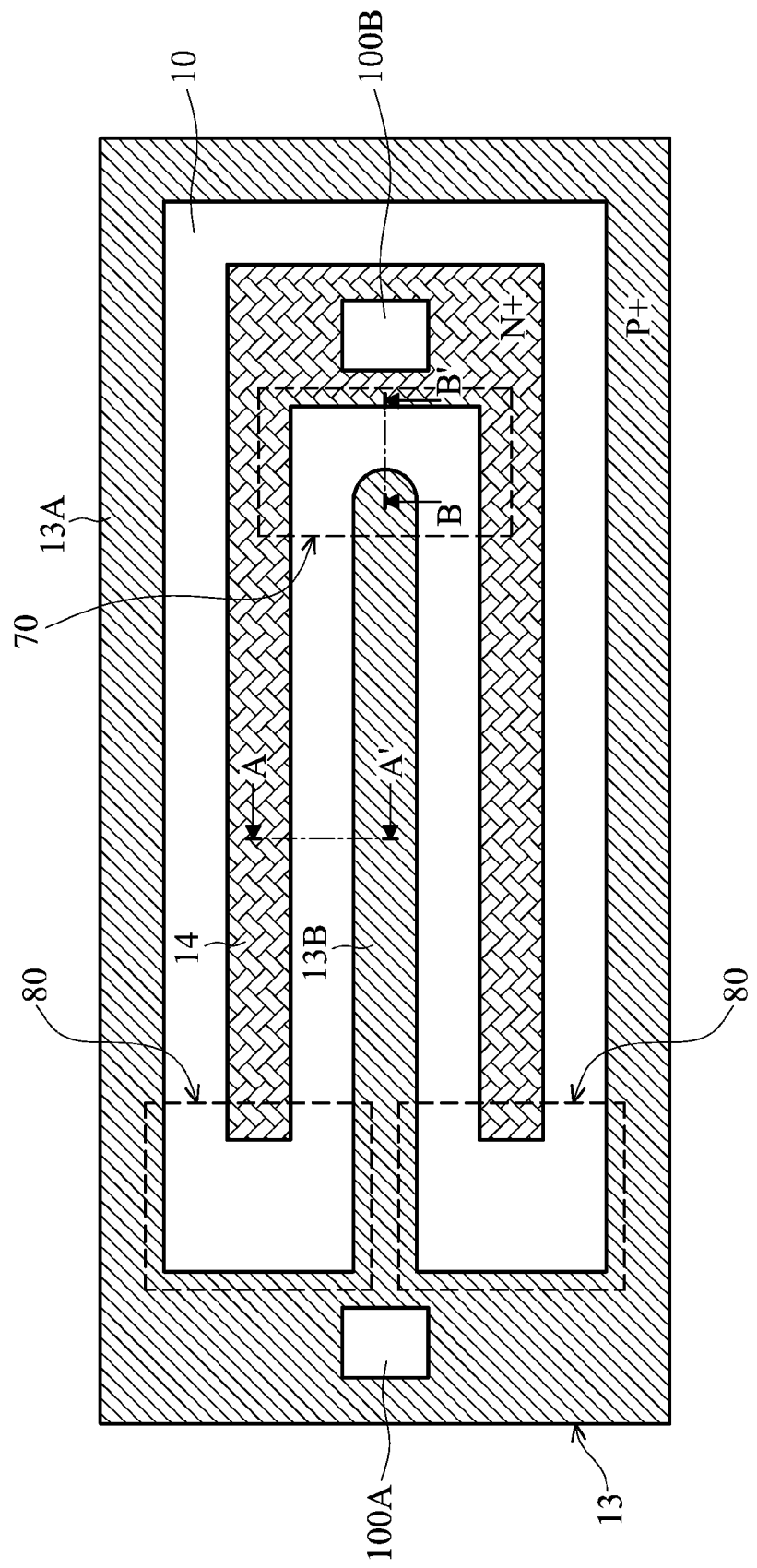
FIG. 1 is a top view of the semiconductor structure of one embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a semiconductor structure. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2:
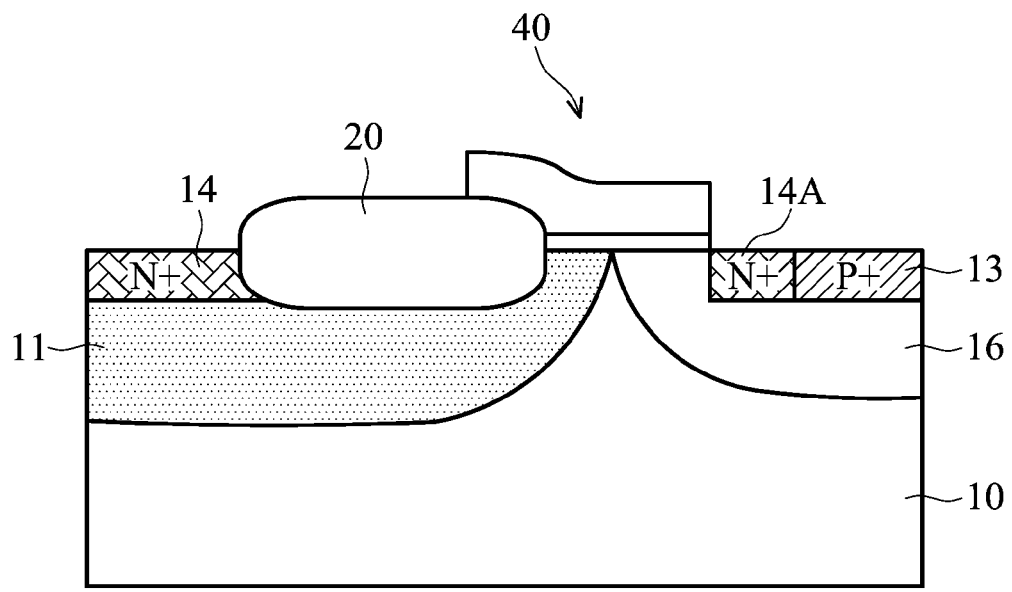
FIG. 2 is a cross-section view of the semiconductor structure along the dotted line AA' in FIG. 1.
Figure 3:
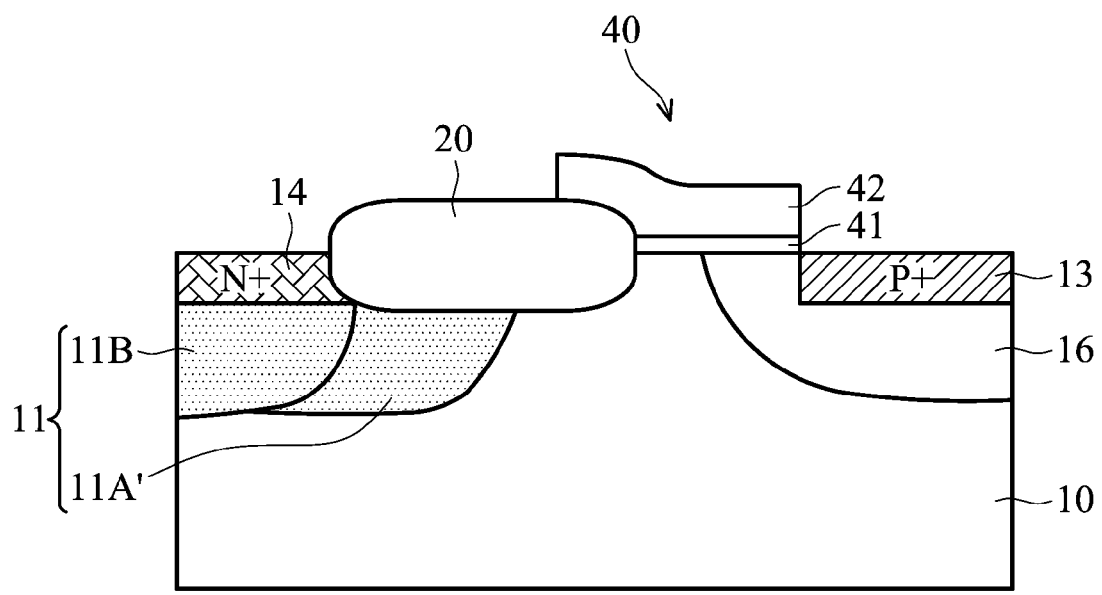
FIG.3 is a cross-section view of the semiconductor structure along the dotted line BB' in FIG. 1.

FIG. 1 is a top view of the semiconductor structure of an embodiment of the invention. FIG. 2 is a cross-section view of the semiconductor structure along the dotted line AA' in FIG. 1. FIG. 3 is a cross-section view of the semiconductor structure along the dotted line BB' in FIG. 1.

Referring to FIG. 2 and FIG. 3, the semiconductor structure comprises a P--type substrate 10. An N-type well region 11 and P⁻-type body doped region 16 is formed in the P⁻-type substrate 10. A P⁺-type doped region 13 is disposed in the substrate surface on a P⁻-type body doped region 16. The P⁺-type doped region 13 may be regarded as an NLDMOS channel region. An N⁺-type doped region 14 is disposed in the substrate surface on the N-type well region 11. In addition, an isolation structure 20 and gate structure 40 is formed on the P⁻-type substrate 10. The gate structure 40 is adjacent to the P⁺-type doped region 13. The isolation structure 20 is disposed between the gate structure 40 and the N⁺-type doped region 14. The difference in FIG. 2 and FIG. 3 is that the semiconductor shown in FIG. 2 comprises an N⁺-type doped region 14A deposited between the N-type well region 11 and P⁺-type doped region 13.

FIG. 1 shows the layout of a P⁻-type substrate 10, a P⁺-type doped region 13, and a N⁺-type doped region 14 of a semiconductor structure. Moreover, pads 100A and 100B are disposed on the P⁺-type doped region 13 and the N⁺-type doped region 14 respectively. For simplification, other elements in FIGS. 2 and 3 are omitted and the not shown in FIG. 1.

Referring to FIG. 1, the P⁺-type doped region 13 comprises a rectangular ring portion 13A and a finger portion 13B. The finger portion 13B is extended from an interior sidewall of and perpendicular to the rectangular ring portion 13A. Moreover, the end region of the finger portion 13B, not adjoined to the rectangular ring portion 13A, is a curved region. The N⁺-type doped region 14 is disposed in a region surrounded by the rectangular ring portion 13A. The N⁺-type doped region 14 is U-shaped. The N⁺-type doped region 14 and the P⁺-type doped region 13 are interdigitated to one another.

Referring to FIGS. 2 and 3, in one embodiment, a drain voltage VDD (not shown) is applied to the N⁺-type doped region 14, a source voltage VSS (not shown) is applied to the N⁺-type doped region 14A and P⁺-type doped region 13, and a gate voltage VG (not shown) is applied to the gate structure 40. The gate voltage VG is same as the drain voltage VDD. Alternatively, the gate voltage VG and the drain voltage VDD may be different. Therefore, the semiconductor structure shown in FIG.2 may be regarded as an LDMOS device, particularly as a lateral diffused MOS (LDMOS), and the semiconductor structure shown in FIG. 3 may be regarded as a diode device.

In one embodiment, the deposition range of the diode device in FIG. 3 is in a region including the end of the P⁺-type doped finger portion 13B, such as region 70 (indicated with a dotted line) shown in FIG. 1, and the deposition range of the LDMOS device shown in FIG. 2 is in all the other regions except for the diode device region. However, not limited to the region 70 that includes the end of the P⁺-type doped finger portion 13B in FIG. 1A, the diode device range may also be in a region including the end of the finger portion of the N⁺-type doped region 14, such as region 80 (indicated with a dotted line). Similarly, when the diode device is formed in the region 80, the end of the finger portion of the N⁺-type doped region 14 may also have a curved portion. For conventional techniques, the rectangular portion 13A and finger portion 13B of the P⁺-type doped region 13 are both LDMOS devices. However, the finger end portion of the LDMOS has a high density surface electric field (crowded electric field), thus reducing breakdown voltage of the LSMOS device and decreasing device lifespan. In embodiments of the invention, the finger end region is the diode to effectively reduce surface electric field density, thus improving upon a crowded electric field.

Moreover, in the preferred embodiment, the N-type impurity concentration distributions of the N-type well region 11 of LDMOS device of FIG. 2 and the N-type well region 11 of diode device of FIG. 3 are substantially different. In N-type well region 11 of diode device of FIG. 3, the impurity concentration of the N-type well region 11B below the N⁺-type doped region 14 is higher than the impurity concentration of the N-type well region 11A' below the isolation structure 20 substantially. Thus, the diode structure has field buffering effect. Moreover, the impurity concentrations of the N-type well region 11B and the N-type well region 11 of LDMOS device are substantially the same or similar. However, in other embodiments, the N-type impurity concentration distributions of the N-type well region 11 of LDMOS device of FIG. 2 and the N-type well region 11 of diode device of FIG. 3 may be the same.

The LDMOS device shown in FIG. 2 is a reduced surface field (RESURF) transistor with lower resistance since the N-type well region 11 under the isolation structure 20 can effectively reduce RESURF. Moreover, when operating the LDMOS, the diode structure in the finger end region 70 in FIG. 3 can reduce electric field generated from the interdigitated finger. Particularly, the diode device has higher field buffering effect as the impurity concentration of the N-type well region 11B below the N⁺-type doped region 14 is higher than the impurity concentration of the N-type well region 11A' substantially below the isolation structure 20. In other embodiments, for example, the LDMOS device may further comprises a P-type doped region (not shown) between the isolation structure 20 and the N-type well region 11, which also can reduce RESURF. Therefore, the LDMOS of the present invention has excellent electric properties.

FIGS. 4 to 9 illustrate the method for forming the semiconductor structure shown in FIG. 3. The method for forming the semiconductor structure in FIG. 2 is not described since which is fabricated with the semiconductor structure in FIG. 3 at the same time.

Figure 4:
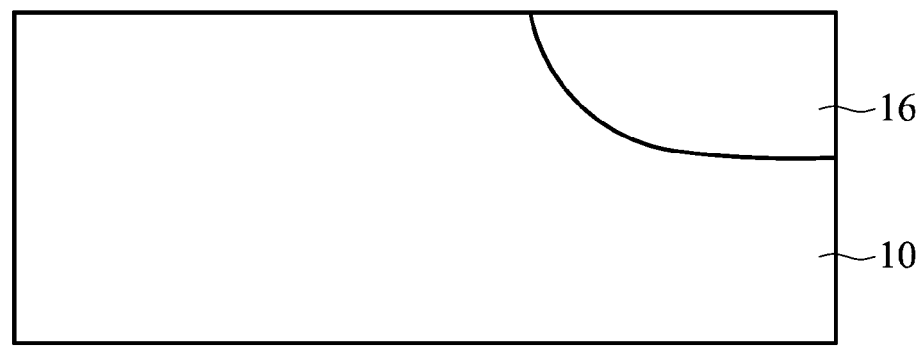
FIGS. 4 to 9 are cross-section views illustrating the method for forming the semiconductor structure of one embodiment of the invention.

Referring to FIG. 4, first, the semiconductor substrate 10 is provided. In one embodiment, the semiconductor substrate 10 may comprise a silicon-on-insulator (SOI) substrate, bulk silicon substrate, or a substrate having a silicon epitaxy layer thereon. The semiconductor substrate 10 may be a first conductive type, such as a P-type or N-type. In this example, the semiconductor substrate 10 is a P⁻-type substrate 10.

Then, the P⁻-type body doped region 16 is formed in the P⁻-type substrate 10. In one embodiment, the P⁻-type body doped region 16 is formed by doping P-type dopants such as boron, gallium, aluminum, indium, or combinations thereof. The dopant concentration can be varied according to manufacturing processes and device characteristics. In one embodiment, the P⁻-type body doped region 16 is formed by performing a doping process with a patterned mask (not shown).

Figure 5:
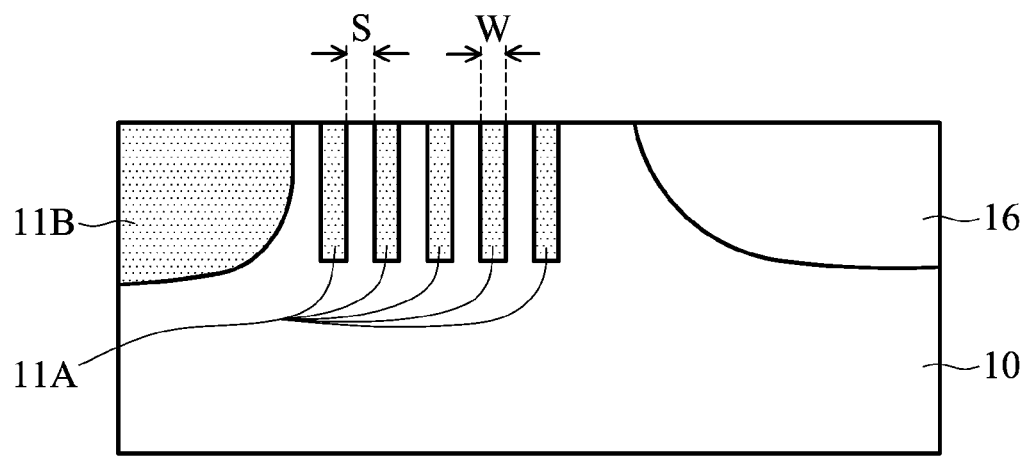

Referring to FIG. 5, an N-type well region 11B and a plurality of the N-type bar regions 11A are formed in the P⁻-type substrate 10. The width W of the N-type bar region 11A and the separated distances S of the adjacent N-type bar regions 11A can be varied according to manufacturing processes and device characteristics. In the preferred embodiment, the thickness W and the separated distance S are substantially equal. In other embodiments, the thickness W and the separated distance S are different. The N-type well region 11B and the N-type bar regions 11A may be formed by doping N-type dopants such as phosphorus, arsenic, nitrogen, antimony, or combinations thereof. The dopant concentration can be varied according to manufacturing processes and device characteristics. In the preferred embodiment, the N-type well region 11B and the N-type bar regions 11A are formed at the same time by a doping process using a patterned mask (not shown), without needing extra masks and processes.

Figure 6:
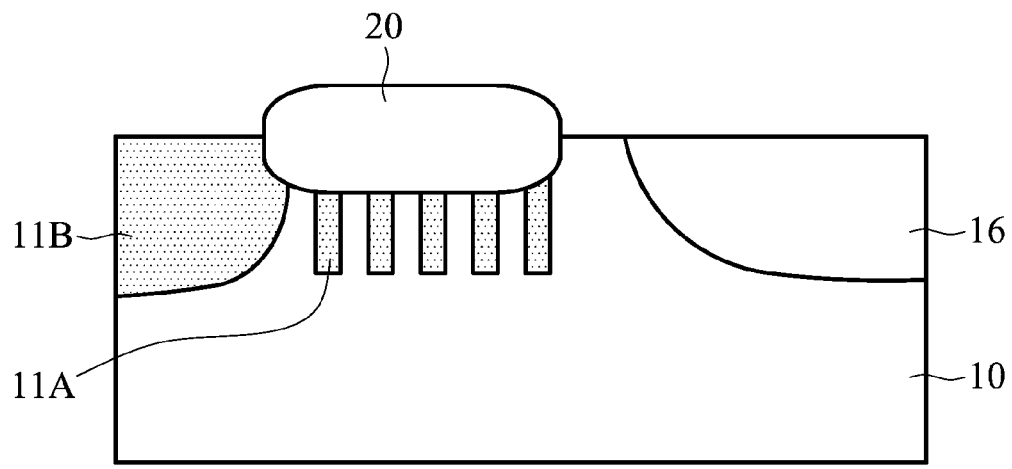

Referring to FIG. 6, the isolation structure 20 is formed on the P⁻-type substrate 10 for defining the active region. Note that the isolation structure 20 is not limited to the example of the field oxide layer, and other isolation structures, such as shallow trench isolation structures, may be used.

Figure 7:
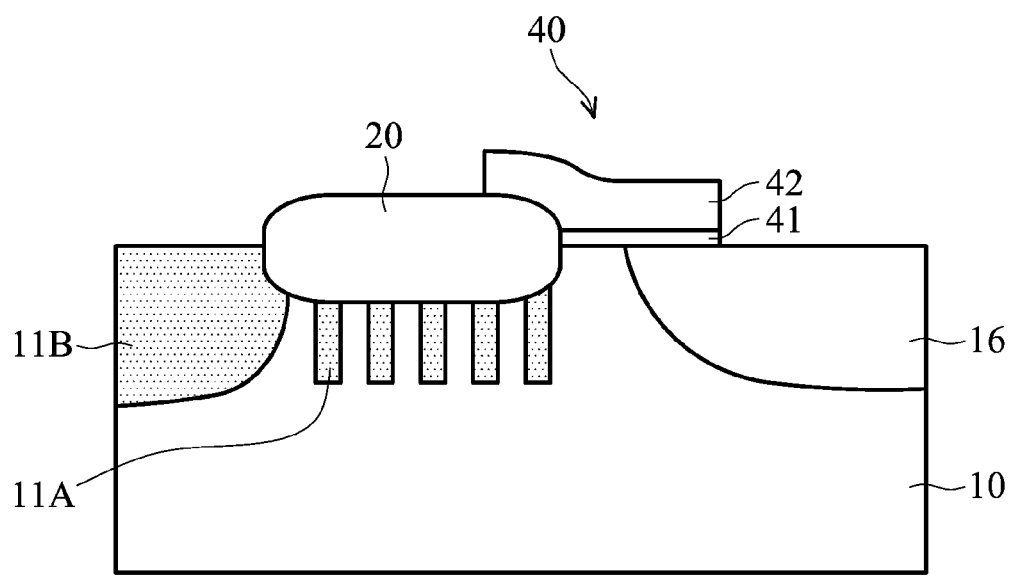

Referring to FIG. 7, the gate structure 40 is formed on the P⁻-type substrate 10. In this example, gate dielectric layer 41 may be formed over a partial surface of the P⁻-type body doped region 16 by, for example, thermal oxidation, chemical vapor deposition, atomic layer CVD, etc. The gate dielectric layer 41 may comprise a common dielectric material, such as oxide, nitride, oxynitride, oxycarbide, or combinations thereof. Alternatively, the gate dielectric layer 41 may comprise a high-k (>8) dielectric material, such as aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$), or combinations thereof. Then, the gate electrode layer 42 may be formed on the gate dielectric layer 41 by deposition methods such as a CVD deposition method. The gate electrode layer 42 may comprise silicon or polysilicon. The gate electrode layer 42 is preferably a doped material for reducing sheet resistance. In other embodiments, the gate electrode layer 42 is amorphous silicon. Furthermore, a metal silicide may be selectively formed on the surface of the gate electrode layer 42.

The gate structure 40 is formed on the substrate 10 by covering of a patterned photoresist (not shown) and then removing a portion of the gate dielectric layer 41 and gate electrode layer 42 by non-isotropic etching. Then, the patterned photoresist is removed. Referring to FIG. 7, the gate structure 40 formed on the P⁻-type substrate 10 covers a portion of the isolation structure 20 and P⁻-type body doped region 16.

Figure 8:
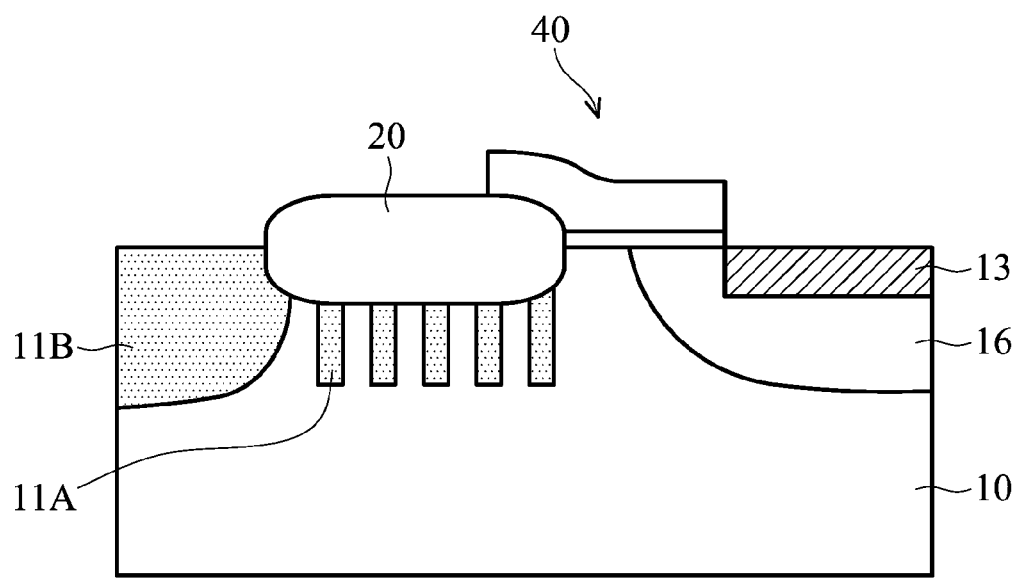

Referring to FIG. 8, the P⁺-type doped region 13 is formed in the P⁻-type body doped region 16. Particularly, the P⁺-type doped region 13 is formed in the upper portion of the P⁻-type body doped region 16. In one embodiment, the P⁺-type doped region 13 may be formed by doping P-type dopants such as boron, gallium, aluminum, indium, or combinations thereof. The dopant concentration can be varied according to manufacturing processes and device characteristics. In one embodiment, the P⁺-type doped region 13 is formed by performing a doping process with a patterned mask (not shown).

Figure 9:
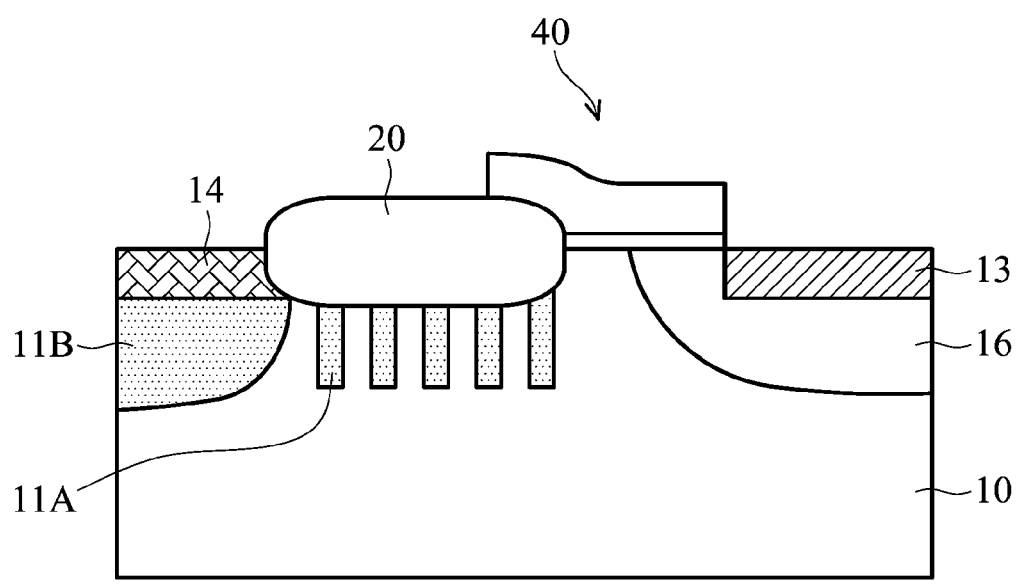

Referring to FIG. 9, the N⁺-type doped region 14 is formed in the N-type well region 11B. Particularly, the N⁺-type doped region 14 is formed in the upper portion of the N-type well region 11B. In one embodiment, the N⁺-type doped region 14 may be formed by doping N-type dopants such as phosphorus, arsenic, nitrogen, antimony, or combinations thereof. The dopant concentration can be varied according to manufacturing processes and device characteristics. In one embodiment, the N⁺-type doped region 14 is formed by performing a doping process with a patterned mask (not shown). At the same time, in FIG. 2, the N⁺-type doped region 14A between the P⁺-type doped region 13 and P⁻-type body doped region 16 below the gate structure 40 is formed by this step. Therefore, the MOS device and diode device are fabricated by using the same process. Extra masks and process are not necessary, thus reducing costs.

In one embodiment, an annealing step may be performed, preferably after the above described steps, for laterally diffusing the dopant of the plurality of the N-type bar regions 11A to form a continuous (or lightened) N-type well region, such as the N-type well region 11A' shown in FIG. 3. Not limited to being performed after all the elements are formed, the annealing step may be performed after forming the N-type well region 11B and the N-type bar regions 11A and before the subsequent steps. In other embodiments, the annealing step may be performed in any suitable condition.

Referring to FIG. 3, in this example, the N-type well region 11A' is adjoined with the N-type well region 11B and P⁻-type body doped region 16. In other embodiments, the first sidewall of the N-type well region 11A' is adjoined to the N-type well region 11B, the opposite second sidewall is disposed below the isolation structure 20 and gate dielectric layer 41 and not contacted with the P⁻-type body doped region 16 (not shown). The net N-type carrier concentration of the N-type well region 11A' is lower than the net N-type carrier concentration of the N-type well region 11B due to laterally-diffusing of the N-type impurities of the N-type bar regions 11A and P-type impurities of the adjacent P⁻-type substrate 10. The dopant concentration of the N-type well region 11A' and 11B can be varied according to manufacturing processes and device characteristics.

Referring to FIG. 3, the formation range and dopant concentration of the N-type well region 11A', N-type well region B, P⁻-type body doped region 16, and P⁻-type substrate 10 may be varied properly according to the RESURF technique. Similarly, In the MOS structure in FIG. 2, the formation range and dopant concentration of the N-type well region 11, P⁻-type body doped region 16, and P⁻-type substrate 10 may also be varied properly according to the RESURF technique.

Some advantages of the semiconductor structure and fabrication method thereof of the invention are described in the following. In the interdigitated P⁺-type doped region and the N⁺-type doped region, the diode structure is formed in the region (or interdigitated region) comprising the finger end, and the LDMOS structure is formed in all the other regions. When the device operates, the diode structure in the interdigitated region can reduce electric field generated from the finger portion. Particularly, the diode structure has much field buffering effect as the impurity concentration of the N-type well region below the N⁺-type doped region is higher than the impurity concentration of the N-type well region below the isolation structure substantially.

In addition, by lightening the dopant concentration of the N-type well region below the gate structure to be smaller than the dopant concentration of the N-type well region below the N⁺-type doped region, an N-type well region and a plurality of the N-type bar regions are simultaneously formed in the substrate by a doping process with a mask. Then, the N-type bar regions are diffused to form a continuous N-type well region by an annealing (or thermally driving-in) step. Moreover, the continuous N-type well region formed below the gate structure is adjoined with the N-type well region below the N⁺-type doped region. Thus, extra masks and process are not necessary and costs are reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). For example, when describing one embodiment of an N-LDMOS, another embodiment can be a P-LDMOS. Therefore, the scope of the appended claims should be accorded the broadest interpretation so as to encompass all such modifications and similar arrangements.

What is claimed is:

1. A semiconductor structure, comprising:
   a first type substrate;
   a first type body doped region on the first type substrate;
     a first type heavily-doped region on the first type body doped region;
   a second type well region on the first type substrate;
   a plurality of second type bar regions between the second type well region and the first type body doped region, wherein the first type body doped region, the second type well region, and each of the second type bar regions are separated to one another by the first type substrate;
   a second type heavily-doped region on the second type well region;
   an isolation structure on the first type substrate between the first type heavily-doped region and second type heavily-doped region, wherein the isolation structure is formed on the second type bar regions and directly in contact with the second type bar regions; and
     a gate structure on the first type substrate between the first type heavily-doped region and isolation structure.

2. The semiconductor structure as claimed in claim 1, wherein the first heavily-doped region comprises a rectangular ring portion and a finger portion, and the finger portion is extended from an interior sidewall of and perpendicular to the rectangular ring portion.

3. The semiconductor structure as claimed in claim 1, wherein the gate structure covers a portion of the isolation structure and the first type body doped region.

4. The semiconductor structure as claimed in claim 1, wherein a width of the second type bar region W and a separated distance S between the adjacent second type bar regions are equal.

5. The semiconductor structure as claimed in claim 1, wherein a width of the second type bar region W and a separated distance S between the adjacent second type bar regions are different.

6. The semiconductor structure as claimed in claim 2, wherein the second type heavily-doped region is U-shaped and is deposited in a region surrounded by the rectangular ring portion of the first type heavily-doped region.

7. The semiconductor structure as claimed in claim 6, wherein the finger portion of the first type heavily-doped region and the U-shaped second type heavily-doped region are interdigitated to one another.

* * * * *